(12) United States Patent
Choi et al.

(10) Patent No.: US 10,109,695 B2
(45) Date of Patent: Oct. 23, 2018

(54) FLEXIBLE DISPLAY PANEL WITH A CONDUCTIVE FILM IN SUBSTRATE LAYER

(71) Applicant: Samsung Display Co., Ltd., Yongin-si, Gyeonggi-do (KR)

(72) Inventors: Yoon Sun Choi, Seoul (KR); Won Suk Choi, Seoul (KR); Sang Jo Lee, Hwaseong-si (KR)

(73) Assignee: Samsung Display Co., Ltd., Gyeonggi-do (KR)

(*) Notice: Subject to any disclaimer, the term of this patent is extended or adjusted under 35 U.S.C. 154(b) by 0 days.

(21) Appl. No.: 15/228,972

(22) Filed: Aug. 4, 2016

(65) Prior Publication Data

US 2017/0092709 A1    Mar. 30, 2017

(30) Foreign Application Priority Data

Sep. 25, 2015  (KR) ........................ 10-2015-0136852

(51) Int. Cl.
| | |
|---|---|
| *H01L 29/08* | (2006.01) |
| *H01L 51/40* | (2006.01) |
| *H01L 27/32* | (2006.01) |
| *H01L 51/52* | (2006.01) |
| *H01L 51/00* | (2006.01) |
| *H01L 27/12* | (2006.01) |

(52) U.S. Cl.
CPC ...... *H01L 27/3262* (2013.01); *H01L 51/0097* (2013.01); *H01L 51/5237* (2013.01); *H01L 51/5253* (2013.01); *H01L 27/1218* (2013.01); *H01L 2251/5338* (2013.01); *Y02E 10/549* (2013.01)

(58) Field of Classification Search
CPC ............ H01L 27/3248; H01L 27/3262; H01L 51/5253; H01L 51/0097
See application file for complete search history.

(56) References Cited

U.S. PATENT DOCUMENTS

| | | | | |
|---|---|---|---|---|
| 8,822,982 B2 * | 9/2014 | Yamazaki | ........... | H01L 21/6835 257/40 |
| 2003/0057422 A1 * | 3/2003 | Yamazaki | ........... | H01L 21/6835 257/79 |
| 2007/0164295 A1 * | 7/2007 | Yamazaki | ........... | H01L 21/6835 257/79 |
| 2013/0343012 A1 * | 12/2013 | Park | ..................... | H05K 7/1417 361/750 |
| 2014/0306876 A1 * | 10/2014 | Lee | ..................... | G06F 1/1652 345/156 |

(Continued)

FOREIGN PATENT DOCUMENTS

| KR | 10-2009-0070055 A | 7/2009 |
|---|---|---|
| KR | 10-1174884 B1 | 8/2012 |

(Continued)

*Primary Examiner* — Alonzo Chambliss
(74) *Attorney, Agent, or Firm* — Knobbe Martens Olson & Bear LLP

(57) ABSTRACT

A flexible display panel is disclosed. In one aspect, the panel includes a substrate including a flexible first substrate layer, a flexible second substrate layer, and a conductive layer interposed between the flexible first and second substrate layers. The panel also includes a transistor provided over the substrate, and an electro-optical active layer provided over the transistor.

16 Claims, 4 Drawing Sheets

(56) References Cited

U.S. PATENT DOCUMENTS

| | | | | |
|---|---|---|---|---|
| 2015/0014635 A1* | 1/2015 | Noh | ................... | H01L 27/3272 |
| | | | | 257/40 |
| 2015/0303389 A1* | 10/2015 | Kim | ................... | H01L 51/0097 |
| | | | | 257/40 |
| 2016/0043349 A1* | 2/2016 | Park | ................... | H01L 51/5271 |
| | | | | 257/40 |
| 2016/0155967 A1* | 6/2016 | Lee | ...................... | G06F 3/0412 |
| | | | | 257/88 |
| 2016/0181287 A1* | 6/2016 | Li | ......................... | H01L 51/56 |
| | | | | 257/72 |

FOREIGN PATENT DOCUMENTS

| | | |
|---|---|---|
| KR | 10-2014-0019699 A | 2/2014 |
| KR | 10-2015-0035256 A | 4/2015 |
| KR | 10-2015-0043890 A | 4/2015 |

\* cited by examiner

FLEXIBLE DISPLAY PANEL WITH A CONDUCTIVE FILM IN SUBSTRATE LAYER

CROSS-REFERENCE TO RELATED APPLICATION

This application claims priority to and the benefit of Korean Patent Application No. 10-2015-0136852 filed in the Korean Intellectual Property Office on Sep. 25, 2015, the entire contents of which are incorporated herein by reference.

BACKGROUND

Field

The described technology generally relates to a flexible display panel.

Description of the Related Technology

As usage of display technology has expanded, market demand for a flexible display has increased. A flexible display can be made portable because it can be freely folded and unfolded and the display can be easily carried. Thus, like electronic paper, a new type of display device to which an existing flat display device cannot be applied has emerged, as well as various types of display devices which have never before been conceived. Utilization of this new type of display device is anticipated to be much wider than typical flat displays.

Such a flexible display device is implemented with a flexible display panel. However, performing iterative folding and unfolding operations while maintaining performance of the display panel has been problematic. When the flexible display panel is repeatedly folded and unfolded, wear on the display device increases, thereby causing fatigue and damage. Also, a stress difference caused by different properties between underlying materials occurs for each constituent element of the display device can degrade the device. Popularization of flexible displays can be better achieved by overcoming the above-stated problems.

The above information disclosed in this Background section is only for enhancement of understanding of the background of the described technology and therefore it can contain information that does not constitute the prior art that is already known in this country to a person of ordinary skill in the art.

SUMMARY OF CERTAIN INVENTIVE ASPECTS

One inventive aspect relates to a flexible display panel that can prevent a product failure and damage to the product.

Another aspect is a flexible display panel that includes: a substrate including a flexible first substrate layer, a flexible second substrate layer, and a conductive layer provided between the first substrate layer and the second substrate layer; a transistor provided on the substrate; and an electro-optical active layer provided on the transistor.

The substrate can include: a first barrier layer provided on the first substrate layer; and a second barrier layer provided on the second substrate layer, wherein the conductive layer can be provided between the first substrate layer and the first barrier layer.

Alternatively, the substrate can include: a first barrier layer provided on the first substrate layer; and a second barrier layer provided on the second substrate layer, wherein the conductive layer can be provided between the first substrate layer and the second barrier layer.

The conductive layer can have sheer resistance of a range between $10^6$ and $10^9$ $\Omega/m^2$.

The transistor can include a gate electrode, a source electrode, and a drain electrode, and, the conductive layer can include a metal that is the same as a metal included in one of the gate electrode, the source electrode, and the drain electrode.

The conductive layer can include a conductive polymer.

The conductive layer can have a mesh shape, and in this case, conductive layer can be formed of nanowires.

The flexible display panel can further include a buffer layer formed between the substrate and the transistor.

Another aspect is a flexible display panel comprising: a substrate including a flexible first substrate layer, a flexible second substrate layer, and a conductive layer interposed between the flexible first and second substrate layers; a transistor provided over the substrate; and an electro-optical active layer provided over the transistor.

In the above flexible display panel, the substrate comprises: a first barrier layer provided over the flexible first substrate layer; and a second barrier layer provided over the flexible second substrate layer, wherein the conductive layer is interposed between the flexible first substrate layer and the first barrier layer.

In the above flexible display panel, the substrate comprises: a first barrier layer provided over the flexible first substrate layer; and a second barrier layer provided over the flexible second substrate layer, wherein the conductive layer is interposed between the flexible first substrate layer and the second barrier layer.

In the above flexible display panel, the conductive layer has sheet resistance in the range of about $10^6$ $\Omega/m^2$ to about $10^9$ $\Omega/m^2$.

In the above flexible display panel, the transistor comprises a gate electrode, a source electrode, and a drain electrode, wherein the conductive layer, the gate electrode, the source electrode, and the drain electrode are formed of the same metal.

In the above flexible display panel, the conductive layer is formed of a conductive polymer.

In the above flexible display panel, the conductive layer has a mesh shape.

In the above flexible display panel, the conductive layer is a mesh formed of nanowires.

The above flexible display panel further comprises a buffer layer interposed between the substrate and the transistor.

In the above flexible display panel, the conductive layer is electrically insulated from the transistor.

In the above flexible display panel, the substrate further comprises a first barrier layer interposed between the conductive layer and the flexible first substrate layer.

Another aspect is a flexible display panel comprising: a substrate; a conductive layer formed over the substrate; a buffer layer formed over the conductive layer; a transistor formed over the buffer layer; and an organic light-emitting diode (OLED) formed over the transistor.

In the above flexible display panel, the substrate further comprises a first substrate layer formed below the conductive layer.

In the above flexible display panel, the conductive layer is thinner than the first substrate layer.

In the above flexible display panel, the substrate further comprises a second substrate layer formed over the conductive layer.

In the above flexible display panel, the conductive layer is thinner than the second substrate layer.

The above flexible display panel further comprises a first barrier layer interposed between the conductive layer and the second substrate layer.

The above flexible display panel further comprises a first barrier layer interposed between the conductive layer and the first substrate layer.

Another aspect is a flexible display panel comprising: a substrate including a first substrate layer and a conductive layer formed over the first substrate layer, wherein the conductive layer has a mesh shape; a transistor formed over the substrate and having a gate electrode, wherein the conductive layer is electrically insulated from the gate electrode; and an electro-optical active layer formed over the transistor.

The above flexible display panel further comprises a barrier layer interposed between the conductive layer and the first substrate layer.

According to at least one of the disclosed embodiments, the flexible display panel can prevent a product failure and damage to the product.

DETAILED DESCRIPTION OF CERTAIN INVENTIVE EMBODIMENTS

Figure 1:
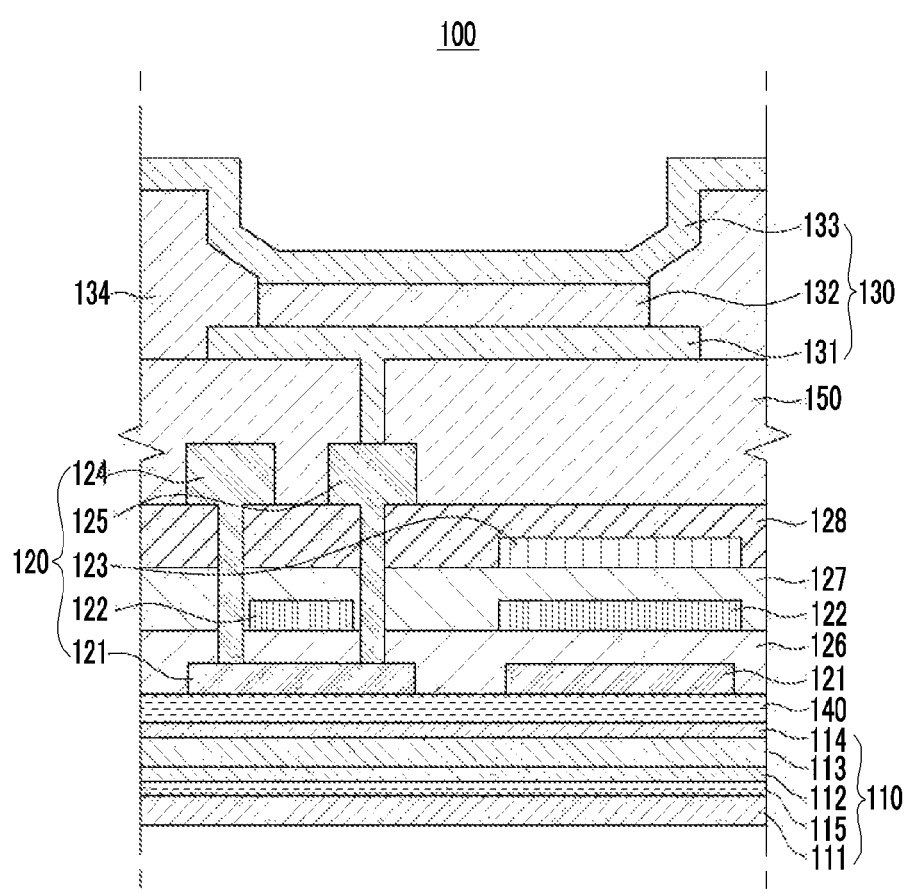
FIG. 1 is a cross-sectional view of a flexible display panel according to an exemplary embodiment.

Hereinafter, exemplary embodiments will be described in detail with reference to the accompanying drawings. However, in describing the described technology, a description of already known functions or configurations will be omitted so as to make the subject matter of the described technology clear.

The drawings and description are to be regarded as illustrative in nature and not restrictive. Like reference numerals designate like elements throughout the specification. In addition, the size and thickness of each configuration shown in the drawings are arbitrarily shown for better understanding and ease of description, but the described technology is not limited thereto.

In the drawings, the thickness of layers, films, panels, regions, etc., are exaggerated for clarity. In the drawings, for better understanding and ease of description, the thickness of some layers and areas is exaggerated. It will be understood that when an element such as a layer, film, region, or substrate is referred to as being "on" another element, it can be directly on the other element or intervening elements can also be present. In this disclosure, the term "substantially" includes the meanings of completely, almost completely or to any significant degree under some applications and in accordance with those skilled in the art. Moreover, "formed, disposed or positioned over" can also mean "formed, disposed or positioned on." The term "connected" includes an electrical connection.

Figure 2:
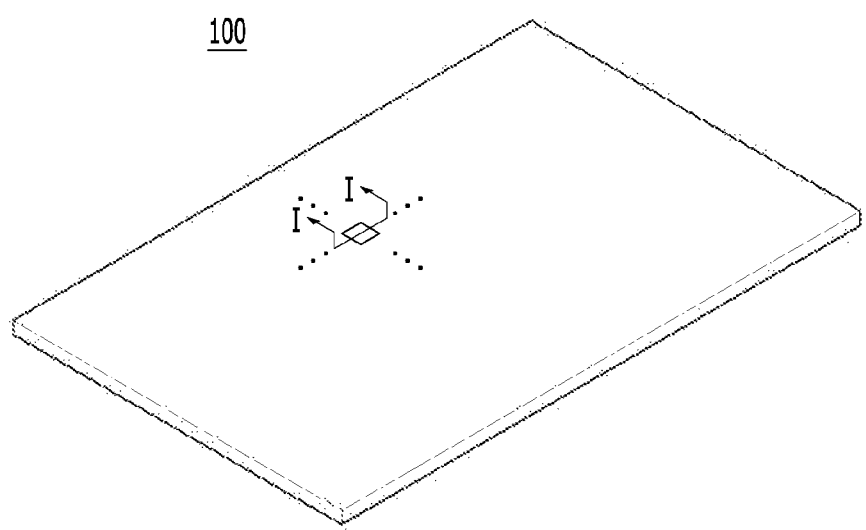
FIG. 2 is a perspective view of the flexible display panel FIG. 1.

FIG. 1 illustrates a cross-sectional view of a part of one of pixels forming a flexible display panel 100 according to an exemplary embodiment of the described technology. FIG. 2 is a perspective view of the flexible display panel 100 where the pixel of FIG. 1 is provided in plural.

As shown in FIG. 1, a flexible display panel 100 includes a substrate 110, a transistor 120, and an organic emission layer 132, which is an example of an electro-optical active layer.

In the present exemplary embodiment, the substrate 110 includes a first substrate layer 111, a second substrate layer 113, and a conductive layer 115. The first substrate layer 111 and the second substrate layer 113 can be formed of a flexible and electrically insulating material. The first substrate layer 111 and the second substrate layer 113 can be formed of the same material and can have the same thickness, but this is not restrictive, and they can be formed of different materials and can have different thicknesses.

In the present exemplary embodiment, the first substrate layer 111 and the second substrate layer 113 can be formed of a polymer resin such as polyimide, polyethylene terephthalate, and the like, and can be formed of a flexible ceramic. In addition to the above-stated material, the range of the described technology is not limited unless the first and second substrate layers 111 and 113 are not flexible and electrically insulated.

As shown in FIG. 1, the conductive layer 115 having electric conductivity can be formed between the first substrate layer 111 and the second substrate 113, which have electrically insulating characteristics. A material of the conductive layer 115 of the present exemplary embodiment is not restrictive unless it is not electrically insulated. However, since the conductive layer 115 of the present exemplary embodiment is applied to the flexible display panel 100, the conductive layer 115 formed between the first substrate layer 111 and the second substrate layer 113 needs physical properties that do not deteriorate performance of the display panel 100 while the flexible display panel 100 is being folded and unfolded.

When the flexible display panel 100 is iteratively folded and unfolded, static electricity generated from the display panel 100 can be concentrated in a folded portion. Such static electricity causes performance deterioration or failure of the display panel 100, and therefore the static electricity should be removed through a process for removal of the static electricity or by using an additional configuration provided for removing the static electricity.

For this purpose, a static electricity removing material can be formed in one surface of the substrate 110, exposed to the outside, but the static electricity removing material is not permanent because the material can be damaged or used up by the external environment when being exposed to the outside for a long period of time.

However, since the conductive layer 115 according to the present exemplary embodiment is provided in the substrate 110, the conductive layer 115 can be protected from the external environment and thus the static electricity formed in the display panel 100 can be semipermanently removed.

In the present exemplary embodiment, the conductive layer 115 can have resistance in a range between about $10^6$ $\Omega/m^2$ and about $10^9$ $\Omega/m^2$ so as to efficiently remove the static electricity while not deteriorating the performance of the display panel 100. Thus, any material having resistance of about $10^6$ $\Omega/m^2$ to about $10^9$ $\Omega/m^2$ can be used to form the conductive layer 115. Accordingly, the material can be a metal having such sheet resistance, a conductive polymer, or a conductive ceramic. The above range can provide an optimum balance between efficiency and performance. However, depending on embodiments, the resistance can be less than about $10^6$ $\Omega/m^2$ or greater than about $10^9$ $\Omega/m^2$.

In the present exemplary embodiment, when the conductive layer 115 is formed of a metal, the conductive layer 115 can be formed of the same metal used in a manufacturing process of the display panel 100. This will be described later in detail.

When the conductive layer 115 is formed of a conductive polymer, the conductive polymer can be a synthetic resin polymer such as poly(3,4-ethylenedioxythiophene) (PEDOT), a derivative of PEDOT, or a combination thereof. However, this is not restrictive, and the conductive layer 115 can be formed of a conductive polymer such as a carbon nanotube or graphene, a derivative of a carbon nanotube or graphene, or a combination thereof.

In the present exemplary embodiment, the conductive layer 115 can wholly cover one side of the first substrate layer 111 by being coated or deposited like other layers formed in the display panel 100, but it is not limited thereto.

Figure 3:
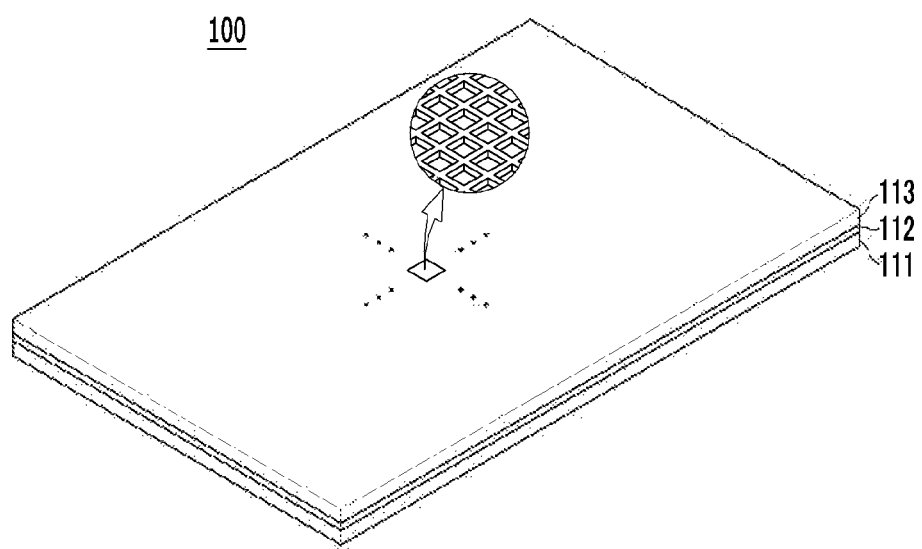
FIG. 3 shows a part of a substrate of a flexible display panel according to an exemplary variation.

FIG. 3 illustrates a substrate 110 including a conductive layer 115 according to an exemplary variation of the described technology. As shown in FIG. 3, the conductive layer 115 according to the exemplary variation can be formed in the shape of a mesh. The mesh-shaped conductive layer 115 as shown in FIG. 3 can be formed of nano-sized wires. Thus, the conductive layer 115 according to the exemplary variation of the described technology can include a mesh formed of a metal nanowire such as a typical nanowire, but this is not restrictive. The conductive layer 115 can include a mesh formed of a nanowire material formed of a conductive polymer such as graphene. In such a case, the conductive layer 115 also has sheet resistance in a range of about $10^6$ $\Omega/m^2$ to about $10^9$ $\Omega/m^2$.

The substrate 110 according to the exemplary embodiment can further include a first barrier layer 112 and a second barrier layer 114. The first barrier layer 112 of the present exemplary embodiment can be formed on the first substrate layer 111 and the second barrier layer 114 can be formed on the second substrate layer 113.

The first barrier layer 112 and the second barrier layer 114 can be formed of inorganic materials, and for example, they can be formed of a material including silicon, such as amorphous silicon, a silicon oxide, or a silicon nitride.

The first barrier layer 112 and the second barrier layer 114 are respectively provided on the first substrate layer 111 and the second substrate layer 113, which are weak to air and moisture, to prevent the first and second substrate layers 111 and 113 from being damaged and prevent permeation of foreign materials such as air and moisture into the display panel 100.

As shown in FIG. 1, the conductive layer 115 according to the present exemplary embodiment can be formed between the first substrate layer 111 and the first barrier layer 112, but this is not restrictive. This will now be described in an exemplary variation of the location of the conductive layer 115 with reference to FIG. 4.

Figure 4:
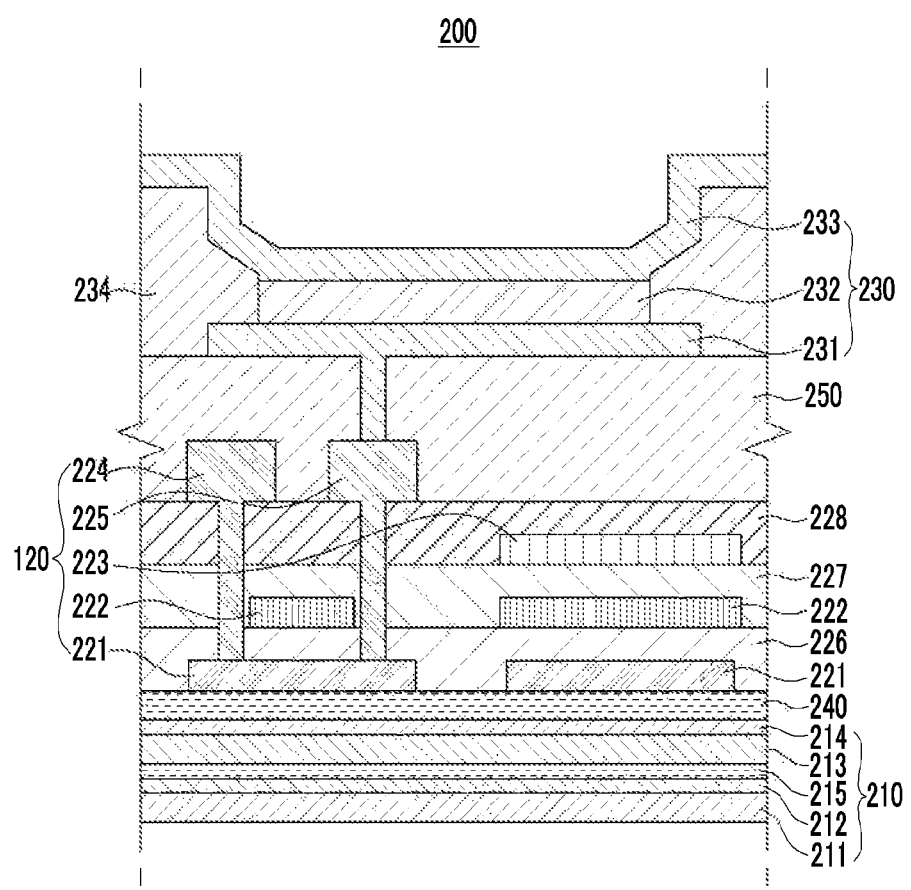
FIG. 4 is a cross-sectional view of a flexible display panel according to another exemplary variation.

FIG. 4 illustrates a cross-sectional view of a part of one of pixels forming the flexible display panel 100 according to an exemplary variation of the described technology. Referring to FIG. 4, unlike as illustrated in FIG. 1, the conductive layer 115 can be provided between the first barrier layer 112 and the second substrate layer 113. Except for the above-stated difference, the contents described in the exemplary embodiment of FIG. 1 can be applied to the exemplary variation of FIG. 4.

Referring back to FIG. 1, the transistor 120 is formed on the substrate 110. In the present exemplary embodiment, the transistor 120 includes a semiconductor layer 121 formed on the substrate 110, a first gate electrode 122 formed corresponding to the semiconductor layer 121, a source electrode 124, and a drain electrode 125. The source electrode 124 and the drain electrode 125 are connected with the semiconductor layer 121 through contact holes. In this case, the transistor 120 according to the present exemplary embodiment can further include a second gate electrode 123 formed in a layer that is different from a layer where the first gate electrode 122 is formed. These electrodes can be electrically conductive.

The conductive layer 115 of the present exemplary embodiment also has electrical conductivity, and therefore signal interference can occur between the conductive layer 115 and the electrodes included in the transistor 120 formed on the substrate 110. The signal interference can affect operation of the transistor 120. In order to minimize the signal interference, the conductive layer 115 can be disposed as far as possible from the transistor 120. For example, the conductive layer 115 can be disposed between the first substrate 111 and the first barrier layer 112 as shown in FIG. 1, or can be disposed between the first barrier layer 112 and the second substrate layer 113 as shown in FIG. 4.

However, these are only examples, and the conductive layer 115 can be disposed in any location of the substrate 110 as long as the conductive layer 115 does not affect driving of the transistor 120.

Meanwhile, when the conductive layer 115 of the present exemplary embodiment is formed of a metal, a metal used in a manufacturing process of the display panel 100 of the present exemplary embodiment can be included.

Thus, the conductive layer 115 can be formed of or can include the same metal used to form the source electrode 124 and the drain electrode 125 of the transistor 120. When the conductive layer 115 is formed of or includes the metal used in the transistor 120, property differences between the respectively layers can be reduced and it is economically advantageous compared to other exemplary embodiments. Thus, damage to the product, such as accumulation of fatigue that can be generated when the flexible display panel 100 is iteratively folded and unfolded, can be prevented.

Electrically insulating layers are respectively provided between the semiconductor layer 121 and the first gate electrode 122, between the first gate electrode 122 and the second gate electrode 123, and between the second gate electrode 123 and the source and drain electrodes 124 and 125 to thereby prevent electrical contact. Specifically, a first gate insulating layer 126 is formed between the semiconductor layer 121 and the first gate electrode 122, a second gate insulating layer 127 is formed between the first gate electrode 122 and the second gate electrode 123, and an interlayer insulating layer 128 is formed between the second gate electrode 123 and the source and drain electrodes 124 and 125 such that the respective electrodes can be prevented from contacting each other, thereby preventing occurrence of a short-circuit.

According to the present exemplary embodiment, a buffer layer 140 can further be formed between the substrate 110 and the transistor 120. The buffer layer 140 can also prevent permeation of foreign materials into the display panel 100 like the first barrier layer 112 and the second barrier layer 114, thereby preventing driving of the transistor 120 from being interfered with by the foreign materials.

As an example of an electro-optical active layer, an organic emission layer 132 can be formed on the transistor 120. Since an organic light-emitting diode (OLED) display panel is illustrated as an example of the display panel 100 of the present exemplary embodiment, the display panel 100 shown in FIG. 1 and FIG. 4 includes the organic emission layer 132 as an example of the electro-optical active layer. However, this is not restrictive, and as an exemplary variation of the present exemplary embodiment, a liquid layer can be included as the electro-optical active layer if the display device is a liquid crystal display (LCD).

As stated above, in FIG. 1 and FIG. 4, an OLED 130 including the organic emission layer 132 that corresponds to an example of the electro-optical active layer according to the present exemplary embodiment is illustrated. The OLED 130 according to the present exemplary embodiment includes a first electrode 131, the organic emission layer 132, and a second electrode 133. The first electrode 131 is formed in a part of an upper portion of a via layer 150 formed for insulation with the transistor 120, and can contact the drain electrode 125 of the transistor 120 by penetrating the via layer 150 such that the first electrode 131 receives an electrical signal from the transistor 120.

A pixel defining layer 134 can be formed in another part of the upper portion of the via layer 150. As shown in FIG. 1 and FIG. 4, the pixel defining layer 134 surrounds the peripheral area of the first electrode 131 while covering a part of edges of the first electrode 131. However, this is only an example, and the pixel defining layer 134 can be formed in parallel with the edge of the first electrode 131. The organic emission layer 132 is formed in an upper portion of the first electrode 131, not covered by the pixel defining layer 134.

The organic emission layer 132 is formed on a portion of the first electrode 131, not covered by the pixel defining layer 134, and holes and electrons provided from the first electrode 131 and the second electrode 133 are coupled with each other in the organic emission layer 132 to form an exciton and the exciton emits light while discharging energy generated when the exciton falls from an excited stated to a ground state.

The second electrode 133 is formed on the organic emission layer 132 and provides electrons to the organic emission layer 132.

In FIG. 1 and FIG. 4, the OLED 130 including the first electrode 131, the organic emission layer 132, and the second electrode 133 according to the exemplary embodiment is illustrated, but this is not restrictive. Thus, as stated above, the electro-optical active layer can be applied to various display panels including not only an LCD including a liquid crystal layer as an electro-optical active layer but also a plasma display panel.

Hereinabove, the flexible display panel 100 according to the exemplary embodiment and the exemplary variations of the exemplary embodiment was described. According to the present exemplary embodiments, the flexible display panel 100 can be prevented from being damaged or being defective.

Although the inventive technology been described and illustrated above, the described technology is not limited to the exemplary embodiments described herein, and it would be apparent to those skilled in the art that variations and modifications might be made to these embodiments without departing from the spirit and the scope of the invention. Therefore, the variations and modifications should not be individually differentiated from the technical spirit or the viewpoint of the present invention, and it should be appreciated that modified exemplary embodiments will be included in the scope of the appended claims.

What is claimed is:

1. A flexible display panel comprising:
    a substrate including a flexible first substrate layer, a conductive layer, a first barrier layer, a flexible second substrate layer, a second barrier layer, and a buffer layer;
    a transistor provided over the substrate; and
    an electro-optical active layer provided over the transistor,
    wherein the flexible first substrate layer and the flexible second layer include a same material,
    wherein the conductive layer is disposed between the flexible first substrate layer and the first barrier layer,
    the first barrier layer is disposed between the conductive layer and the flexible second layer,
    the flexible second substrate layer is disposed between the first barrier layer and the second barrier layer, and
    the second barrier layer is disposed between the flexible second substrate layer and the buffer layer.

2. The flexible display panel of claim 1, wherein the conductive layer has sheet resistance in the range of about $10^6$ $\Omega/m^2$ to about $10^9$ $\Omega/m^2$.

3. The flexible display panel of claim 1, wherein the transistor comprises a gate electrode, a source electrode, and a drain electrode, and the conductive layer comprises a metal that is the same as a metal included in one of the gate electrode, the source electrode, and the drain electrode.

4. The flexible display panel of claim 1, wherein the conductive layer is formed of a conductive polymer.

5. The flexible display panel of claim 1, wherein the conductive layer has a mesh shape.

6. The flexible display panel of claim 5, wherein the conductive layer is a mesh formed of nanowires.

7. The flexible display panel of claim 1, further comprising a buffer layer interposed between the substrate and the transistor.

8. The flexible display panel of claim 1, wherein the conductive layer is electrically insulated from the transistor.

9. The flexible display panel of claim 1, wherein the substrate further comprises a first barrier layer interposed between the conductive layer and the flexible first substrate layer.

10. A flexible display panel comprising:
    a substrate including flexible first substrate layer, a conductive layer, a first barrier layer, a flexible second substrate layer, a second barrier layer, and a buffer layer;
    a transistor disposed over the buffer layer; and
    an organic light-emitting diode (OLED) disposed formed over the transistor,
    wherein the conductive layer is disposed between the flexible first substrate layer and the first barrier layer,
    the first barrier layer is disposed between the conductive layer and the flexible second layer,
    the flexible second substrate layer is disposed between the first barrier layer and the second barrier layer, and
    the second barrier layer is disposed between the flexible second substrate layer and the buffer layer, and
    wherein the first substrate layer and the second layer include a same material.

11. The flexible display panel of claim 10, wherein the conductive layer is thinner than the first substrate layer.

12. The flexible display panel of claim 10, wherein the conductive layer is thinner than the second substrate layer.

13. The flexible display panel of claim 12, further comprising a first barrier layer interposed between the conductive layer and the second substrate layer.

14. The flexible display panel of claim 12, further comprising a first barrier layer interposed between the conductive layer and the first substrate layer.

15. A flexible display panel comprising:
    a substrate including a first substrate layer and a conductive layer formed over the first substrate layer, wherein the conductive layer has a mesh shape;

a transistor formed over the substrate and having a gate electrode, wherein the conductive layer is electrically insulated from the gate electrode; and an electro-optical active layer formed over the transistor.

16. The flexible display panel of claim 15, further comprising a barrier layer interposed between the conductive layer and the first substrate layer.

* * * * *